(12) United States Patent
Yamaguchi

(10) Patent No.: US 11,496,169 B2
(45) Date of Patent: *Nov. 8, 2022

(54) RADIO FREQUENCY MODULE AND COMMUNICATION DEVICE

(71) Applicant: Murata Manufacturing Co., Ltd., Nagaokakyo (JP)

(72) Inventor: Yukiya Yamaguchi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/232,150

(22) Filed: Apr. 16, 2021

(65) Prior Publication Data

US 2021/0336641 A1 Oct. 28, 2021

(30) Foreign Application Priority Data

Apr. 23, 2020 (JP) .............................. JP2020-076984

(51) Int. Cl.
*H04B 1/40* (2015.01)
*H04B 1/04* (2006.01)
(Continued)

(52) U.S. Cl.
CPC ......... *H04B 1/0483* (2013.01); *H04B 1/0475* (2013.01); *H04B 1/1607* (2013.01); *H04B 1/44* (2013.01); *H04B 2001/0408* (2013.01)

(58) Field of Classification Search
CPC ...... H04B 1/04; H04B 1/0458; H04B 1/0475; H04B 1/0483; H04B 1/1607; H04B 1/38; H04B 1/3827; H04B 1/3833; H04B 1/40; H04B 1/44; H04B 2001/0408; H04B 2001/045; H03F 1/565; H03F 3/245;
(Continued)

(56) References Cited

U.S. PATENT DOCUMENTS 6,329,879 B1 * 12/2001 Maruyama .............. H03F 1/565
330/133
6,501,159 B2 * 12/2002 Olofsson ............. H01L 23/4824
257/676

(Continued)

FOREIGN PATENT DOCUMENTS

WO 2012/033885 A1 3/2012

*Primary Examiner* — Quochien B Vuong
(74) *Attorney, Agent, or Firm* — Xsensus LLP

(57) ABSTRACT

A radio frequency module includes: a module board including first and second principal surfaces; first and second power amplifiers on the first principal surface; external-connection terminals on the second principal surface; and first and second via conductors connecting the first and second principal surfaces. The first and second via conductors are spaced apart in the module board, one end of the first via conductor is connected to a first ground electrode of the first power amplifier, the other end of the first via conductor is connected to a first external-connection terminal, one end of the second via conductor is connected to a second ground electrode of the second power amplifier, the other end of the second via conductor is connected to a second external-connection terminal, and the first and second via conductors each penetrate through the module board in a direction normal to the first and second principal surfaces.

20 Claims, 6 Drawing Sheets

(51) Int. Cl.
*H04B 1/16* (2006.01)
*H04B 1/44* (2006.01)

(58) Field of Classification Search
CPC ......... H03F 2200/222; H03F 2200/294; H03F 2200/451
See application file for complete search history.

(56) References Cited

U.S. PATENT DOCUMENTS

| | | | |
|---|---|---|---|
| 7,486,142 B2 * | 2/2009 | Tsurumaki | H03F 3/343 330/296 |
| 10,568,199 B2 * | 2/2020 | Chang | H01L 23/49589 |
| 10,643,962 B1 * | 5/2020 | Ichitsubo | H04B 1/0458 |

\* cited by examiner

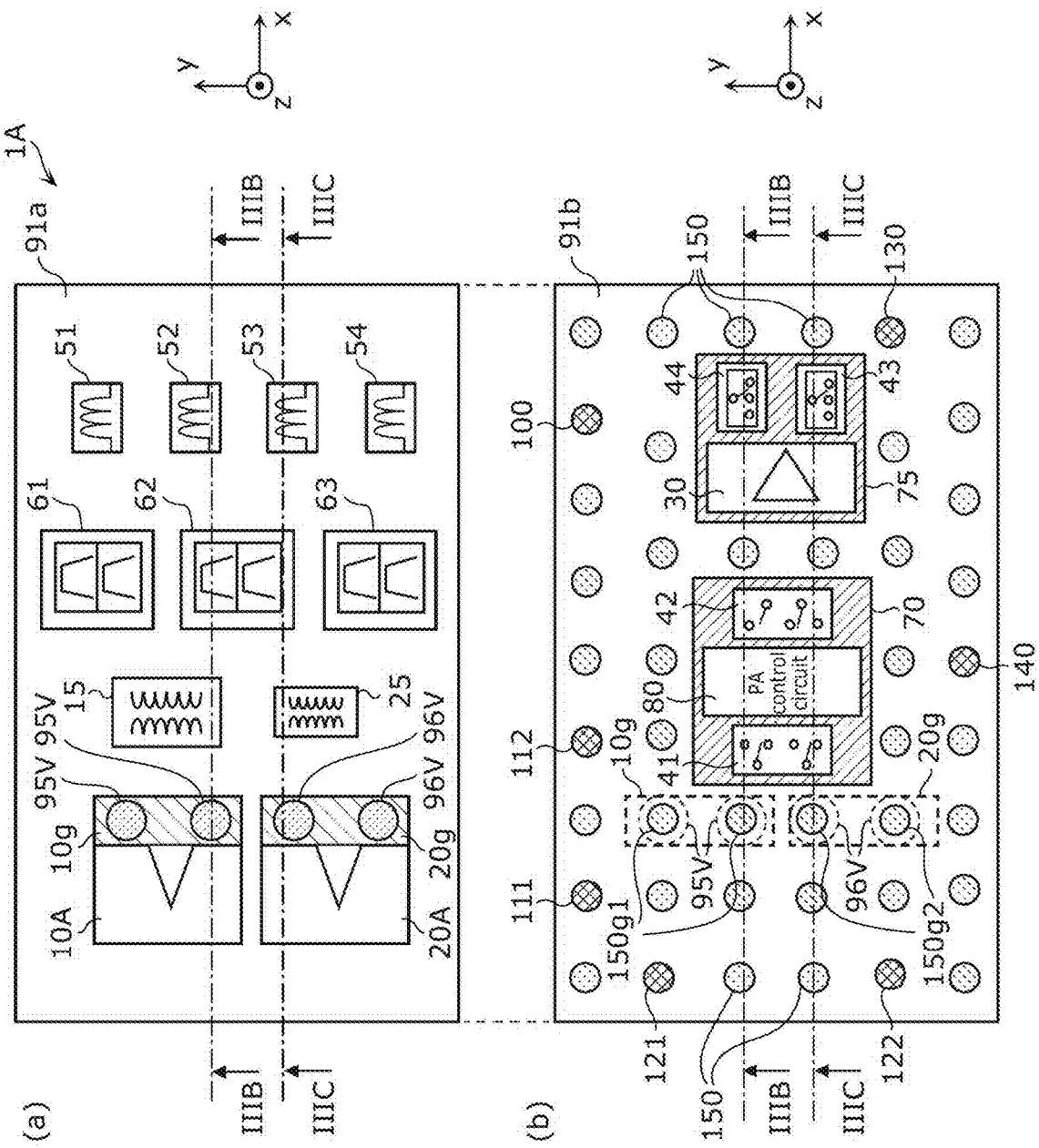

RADIO FREQUENCY MODULE AND COMMUNICATION DEVICE

CROSS-REFERENCE TO RELATED APPLICATIONS

The present application is based on and claims priority to Japanese Patent Application No. 2020-076984 filed on Apr. 23, 2020. The entire disclosure of the above-identified application, including the specification, drawings and claims is incorporated herein by reference in its entirety.

TECHNICAL FIELD

The present disclosure relates to a radio frequency (RF) module and a communication device.

BACKGROUND

In mobile communication devices such as a mobile phone, the number of circuit elements included in radio frequency front-end circuits increases, particularly with developments in multiband technologies.

WO2012/33885 discloses a radio frequency module (electronic component module) in which electronic components included in a radio frequency front-end circuit are mounted on both surfaces of the circuit board. The electronic components mounted on the circuit board are covered with a sealing resin layer, and connection terminals (pad electrodes) for connection with a motherboard are disposed on a surface of the sealing resin layer.

SUMMARY

Technical Problems

When the radio frequency module disclosed by WO2012/33885 is applied to a radio frequency front-end circuit that supports multi-band technologies, it is necessary to ensure measures to dissipate heat generated by electronic components mounted on the circuit board, for signal paths through which signals of communication bands are transferred.

However, as recognized by the present inventor, when a large amount of heat is generated by electronic components, the heat generated by the electronic components is transferred via the circuit board to electronic components mounted on a surface on the opposite side, and also transferred among electronic components provided for the respective communication bands, leading to degradation in the properties of the radio frequency module.

The present disclosure addresses the above-described problems, and is presented to provide a radio frequency module and a communication device that have enhanced heat dissipation properties and support multi-band technologies.

Solutions

In order to provide such a radio frequency module and such a communication device as described above, a radio frequency module according to one aspect of the present disclosure includes a module board including a first principal surface and a second principal surface on opposite sides of the module board; a first power amplifier disposed on the first principal surface and configured to amplify a transmission signal of a first frequency band; a second power amplifier disposed on the first principal surface and configured to amplify a transmission signal of a second frequency band different from the first frequency band; a plurality of external-connection terminals disposed on the second principal surface; a first via conductor provided in the module board, the first via conductor connecting the first principal surface and the second principal surface; and a second via conductor provided in the module board, the second via conductor connecting the first principal surface and the second principal surface. In this radio frequency module, the first via conductor and the second via conductor are spaced apart from each other in the module board, one of ends of the first via conductor is connected, on the first principal surface, to a first ground electrode of the first power amplifier, and a remaining one of the ends of the first via conductor is connected, on the second principal surface, to a first external-connection terminal among the plurality of external-connection terminals, the first external-connection terminal being set to ground potential, one of ends of the second via conductor is connected, on the first principal surface, to a second ground electrode of the second power amplifier, and a remaining one of the ends of the second via conductor is connected, on the second principal surface, to a second external-connection terminal among the plurality of external-connection terminals, the second external-connection terminal being set to ground potential, and the first via conductor and the second via conductor each penetrate through the module board in a direction normal to the first principal surface.

Advantageous Effects

According to the present disclosure, a radio frequency module and a communication device that have enhanced heat dissipation properties and support multi-band technologies are provided.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 3A is a schematic diagram illustrating a plan view configuration of a radio frequency module according to a working example.

DESCRIPTION OF EMBODIMENTS

Figure 1:
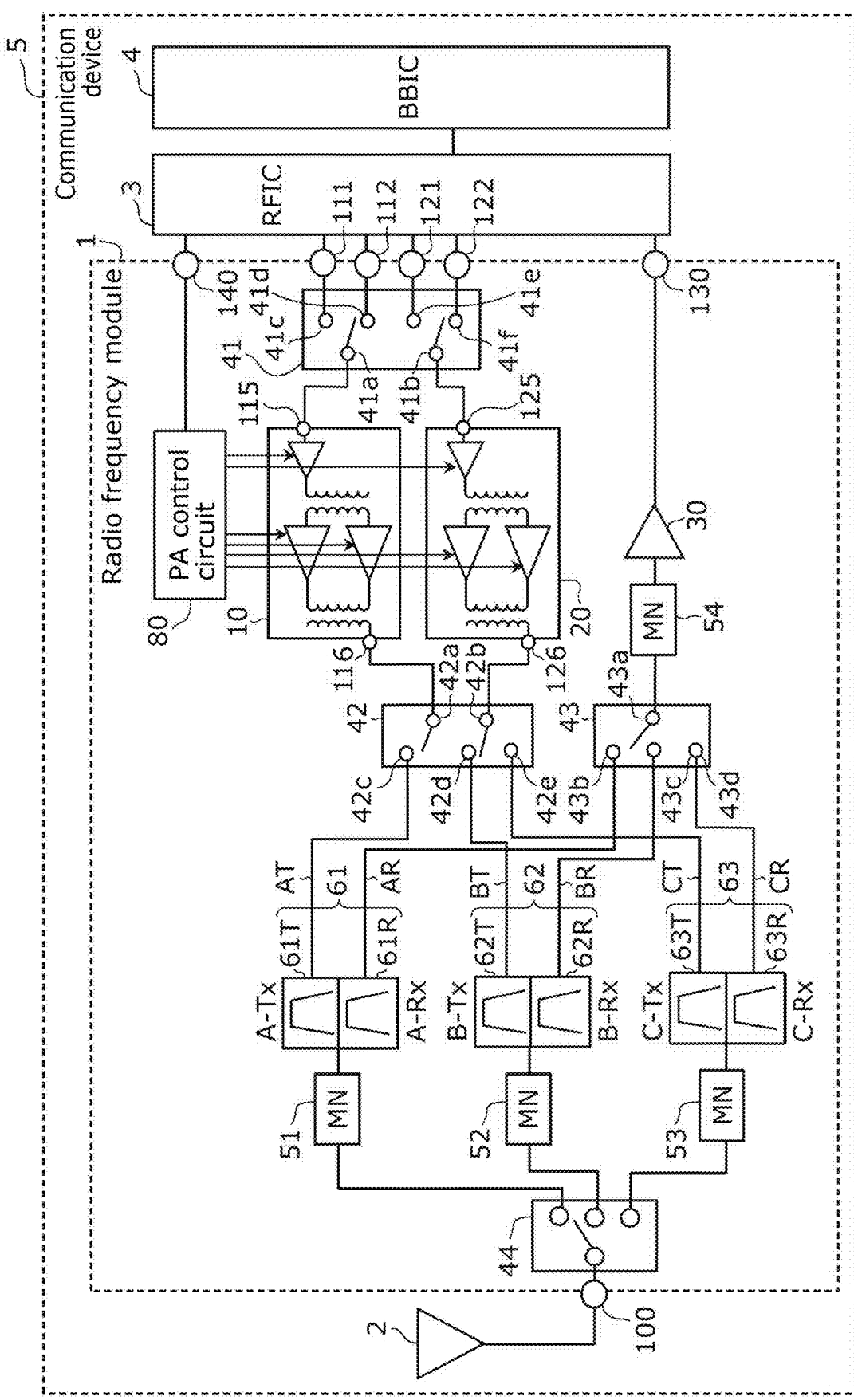
FIG. 1 is a diagram illustrating a circuit configuration of a radio frequency module (or RF front-end circuitry) and a communication device according to an embodiment.

The following describes in detail embodiments of the present disclosure. Each of the embodiments described below illustrates a general or specific example. The numerical values, shapes, materials, structural components, the arrangement and connection of the structural components, and so on, illustrated in the following embodiments are mere examples, and therefore do not limit the present disclosure. Among the structural components in the following working examples and variations, structural components not recited in the independent claims are described as arbitrary structural components. In addition, the sizes of structural components and the ratios of the sizes in the drawings are not necessarily strictly illustrated. In each of the diagrams, substantially the same structural components are denoted by the same reference signs, and redundant description may be omitted or simplified.

In addition, in the following description, terms indicating relationships between components such as parallel and vertical and terms indicating the shapes of components such as a quadrilateral shape, and numerical ranges do not represent only the strict meanings but include also a substantially equivalent range, such as a difference of approximately several percent.

In addition, in the following description, in an example of A, B, and C being mounted on a board, "in a plan view of the board (or the principal surface of the board), C is disposed between A and B" means that at least one of a plurality of line segments connecting arbitrary points in A and arbitrary points in B passes through a region in C in a plan view of the board. Furthermore, a plan view of the board means that the board and circuit elements mounted on the board are orthographically projected on a plane parallel to the principal surface of the board.

In addition, in the following description, a "transmission path" refers to a transfer path including a line along which a radio frequency transmission signal propagates, an electrode directly connected to the line, a terminal directly connected to the line or the electrode, etc. Furthermore, a "reception path" refers to a transfer path including a line along which a radio frequency reception signal propagates, an electrode directly connected to the line, a terminal directly connected to the line or the electrode, etc. Furthermore, a "transmission and reception path" refers to a transfer path including a line along which a radio frequency transmission signal and a radio frequency reception signal propagate, an electrode directly connected to the line, a terminal directly connected to the line or the electrode, etc.

EMBODIMENT

1. Circuit Configuration of Radio Frequency Module 1 and Communication Device 5

FIG. 1 is a diagram illustrating a circuit configuration of radio frequency module 1 and communication device 5 according to an embodiment. As illustrated in this diagram, communication device 5 includes radio frequency module 1, antenna 2, RF signal processing circuit (RFIC) 3, and baseband signal processing circuit (BBIC) 4.

RFIC 3 is an RF signal processing circuit that processes a radio frequency signal to be transmitted by antenna 2 and processes a radio frequency signal received by antenna 2. More specifically, RFIC 3 performs signal processing, by down-conversion or the like, on a reception signal that has been input via the reception signal path of radio frequency module 1, and outputs the reception signal generated by the signal processing to BBIC 4. In addition, RFIC 3 performs signal processing, by up-conversion or the like, on a transmission signal that has been input from BBIC 4, and outputs the transmission signal generated by the signal processing to the transmission signal path of radio frequency module 1.

BBIC 4 is a circuit that performs signal processing using an intermediate frequency band having a lower frequency than a frequency band of a radio frequency signal that is transferred through radio frequency module 1. The signal processed by BBIC 4 is, for example, used as an image signal for image display or as a sound signal for telephone conversation via a speaker.

RFIC 3 also functions as a controller that controls the connection of switches 41, 42, 43, and 44 included in radio frequency module 1, based on a communication band (frequency band) used. Specifically, RFIC 3 controllably switches connection between switches 41 to 44 included in radio frequency module 1, by a control signal (not illustrated). More specifically, RFIC 3 outputs a digital control signal for controlling switches 41 to 44, to power amplifier (PA) control circuit 80. PA control circuit 80 of radio frequency module 1 outputs a digital control signal to switches 41 to 44 according to the digital control signal that has been input from RFIC 3, thereby controlling connection and disconnection of switches 41 to 44.

RFIC 3 also functions as a controller that controls the gains of transmission amplifier circuits 10 and 20 included by radio frequency module 1, and power supply voltage Vcc and bias voltage Vbias that are supplied to transmission amplifier circuits 10 and 20. More specifically, RFIC 3 outputs digital control signals to control signal terminal 140 of radio frequency module 1. PA control circuit 80 of radio frequency module 1 outputs a control signal, power supply voltage Vcc, or bias voltage Vbias to transmission amplifier circuits 10 and 20 according to the digital control signal that has been input via control signal terminal 140, thereby adjusting the gains of transmission amplifier circuits 10 and 20. It should be noted that a control signal terminal that receives, from RFIC 3, a digital control signal for controlling the gains of transmission amplifier circuits 10 and 20 may be different from a control signal terminal that receives, from RFIC 3, a digital control signal for controlling power supply voltage Vcc and bias voltage Vbias to be supplied to transmission amplifier circuits 10 and 20. In addition, the controller may be disposed outside RFIC 3, for example, in BBIC 4.

Antenna 2 is connected to antenna connection terminal 100 of radio frequency module 1, and emits a radio frequency signal that has been output from radio frequency module 1. In addition, antenna 2 receives a radio frequency signal from the outside, and outputs the received radio frequency signal to radio frequency module 1.

It should be noted that, in communication device 5 according to the present embodiment, antenna 2 and BBIC 4 are not indispensable components.

Next, a detailed configuration of radio frequency module 1 will be described.

As illustrated in FIG. 1, radio frequency module 1 includes: antenna connection terminal 100; transmission amplifier circuits 10 and 20; low noise amplifier 30; transmission filters 61T, 62T, and 63T; reception filters 61R, 62R, and 63R; PA control circuit 80; matching circuits (matching network (MN)) 51, 52, 53, and 54; and switches 41, 42, 43, and 44.

Antenna connection terminal 100 is a common antenna terminal connected to antenna 2.

Transmission amplifier circuit 10 is an amplifier circuit of a differential amplifier type that amplifies transmission signals of communication band A and communication band B that have been input through transmission input terminals 111 and 112. It should be noted that radio frequency module 1 may include, instead of transmission amplifier circuit 10, a first transmission amplifier circuit that amplifies a radio frequency signal of communication band A and a second transmission amplifier circuit that amplifies a radio frequency signal of communication band B.

Transmission amplifier circuit 20 is an amplifier circuit of a differential amplifier type that amplifies transmission signals of communication band C that have been input through transmission input terminals 121 and 122.

PA control circuit 80 adjusts the gains of amplifying elements included in transmission amplifier circuits 10 and 20, using a digital control signal input through control signal terminal 140. PA control circuit 80 may be implemented as a semiconductor integrated circuit (IC). The semiconductor IC has, for example, a complementary metal oxide semiconductor (CMOS) structure. More specifically, the semiconductor IC is fabricated by silicon on insulator (SOI) processing. This allows manufacturing the semiconductor IC at a low manufacturing cost. It should be noted that the semiconductor IC may include at least one of GaAs, SiGe, or GaN. With this, it is possible to output a radio frequency signal having a high-quality amplification performance and noise characteristics.

Low noise amplifier 30 is an amplifier that amplifies radio frequency signals of communication bands A, B, and C with low noise, and outputs the amplified radio frequency signals to reception output terminal 130. It should be noted that radio frequency module 1 may include a plurality of low noise amplifiers. For example, radio frequency module 1 may include a first low noise amplifier that amplifies radio frequency signals of communication bands A and B, and a second low noise amplifier that amplifies radio frequency signals of communication band C.

It should be noted that, in the present embodiment, communication bands A and B are lower in frequency than communication band C. Communication bands A and B are, for example, communication bands that belong to a middle band group (1.45 GHz to 2.2 GHz), and communication band C is, for example, a communication band that belongs to a high band group (2.3 GHz to 2.7 GHz). However, the high-low frequency relationship between communication band C and communication bands A and B is not limited to the above-described example. Accordingly, communication bands A and B may be higher in frequency than communication band C. It should be noted that the middle band group is one example of the first frequency band, and communication band C is one example of the second frequency band different from the first frequency band.

Transmission filter 61T is disposed on transmission path AT that connects antenna connection terminal 100 and transmission input terminals 111 and 112, and passes a transmission signal in a transmission band of communication band A, among the transmission signals that have been amplified by transmission amplifier circuit 10. Transmission filter 62T is disposed on transmission path BT that connects antenna connection terminal 100 and transmission input terminals 111 and 112, and passes a transmission signal in a transmission band of communication band B, among the transmission signals that have been amplified by transmission amplifier circuit 10. Transmission filter 63T is disposed on transmission path CT that connects antenna connection terminal 100 and transmission input terminals 121 and 122, and passes a transmission signal in a transmission band of communication band C, among the transmission signals that have been amplified by transmission amplifier circuit 20.

Reception filter 61R is disposed on reception path AR that connects antenna connection terminal 100 and reception output terminal 130, and passes a reception signal in a reception band of communication band A, among the reception signals that have been input through antenna connection terminal 100. Reception filter 62R is disposed on reception path BR that connects antenna connection terminal 100 and reception output terminal 130, and passes a reception signal in a reception band of communication band B, among the reception signals that have been input through antenna connection terminal 100. Reception filter 63R is disposed on reception path CR that connects antenna connection terminal 100 and reception output terminal 130, and passes a reception signal in a reception band of communication band C, among the reception signals that have been input through antenna connection terminal 100.

Transmission filter 61T and reception filter 61R are included in duplexer 61 that has, as a passband, communication band A. Duplexer 61 transfers a transmission signal and a reception signal of communication band A in a frequency division duplex (FDD) system. Transmission filter 62T and reception filter 62R are included in duplexer 62 that has, as a passband, communication band B. Duplexer 62 transfers a transmission signal and a reception signal of communication band B in the FDD system. Transmission filter 63T and reception filter 63R are included in duplexer 63 that has, as a passband, communication band C. Duplexer 63 transfers a transmission signal and a reception signal of communication band C in the FDD system.

It should be noted that each of duplexers 61 to 63 may be a multiplexer including only a plurality of transmission filters, a multiplexer including only a plurality of reception filters, or a multiplexer including a plurality of duplexers. In addition, transmission filter 61T and reception filter 61R need not necessarily be included in duplexer 61. Transmission filter 61T and reception filter 61R may be a single filter that transfers a transmission signal and a reception signal of communication band A in a time division duplex (TDD) system. In this case, a switch for switching between transmission and reception is disposed on at least one of a preceding stage or a following stage of the single filter. In the same manner as above, transmission filter 62T and reception filter 62R need not necessarily be included in duplexer 62. Transmission filter 62T and reception filter 62R may be a single filter that transfers a transmission signal and a reception signal of communication band B in the TDD system. In the same manner as above, transmission filter 63T and reception filter 63R need not necessarily be included in duplexer 63. Transmission filter 63T and reception filter 63R may be a single filter that transfers a transmission signal and a reception signal of communication band C in the TDD system.

Matching circuit 51 is disposed on a path that connects switch 44 and duplexer 61, and matches the impedance of switch 44 and antenna 2 with the impedance of duplexer 61. Matching circuit 52 is disposed on a path that connects switch 44 and duplexer 62, and matches the impedance of switch 44 and antenna 2 with the impedance of duplexer 62. Matching circuit 53 is disposed on a path that connects switch 44 and duplexer 63, and matches the impedance of switch 44 and antenna 2 with the impedance of duplexer 63.

Matching circuit 54 is disposed on a reception path that connects low noise amplifier 30 and switch 43, and matches the impedance of low noise amplifier 30 with the impedance of switch 43 and duplexers 61 to 63.

Switch 41 includes common terminals 41a and 41b, and selection terminals 41c, 41d, 41e, and 41f. Common terminal 41a is connected to input terminal 115 of transmission amplifier circuit 10. Common terminal 41b is connected to input terminal 125 of transmission amplifier circuit 20. Selection terminal 41c is connected to transmission input terminal 111, selection terminal 41d is connected to transmission input terminal 112, selection terminal 41e is connected to transmission input terminal 121, and selection terminal 41f is connected to transmission input terminal 122. Switch 41 is disposed on the input terminal side of transmission amplifier circuits 10 and 20. In the above-described connection configuration, switch 41 switches connection of transmission amplifier circuit 10 between transmission input terminal 111 and transmission input terminal 112, and switches connection of transmission amplifier circuit 20 between transmission input terminal 121 and transmission input terminal 122. Switch 41 is implemented as, for example, a double pole triple throw (DP4T) switching circuit.

It should be noted that switch 41 may include: a single pole double throw (SPDT) switch which includes common terminal 41a and selection terminals 41c and 41d; and an SPDT switch which includes common terminal 41b and selection terminals 41e and 41f.

A transmission signal of communication band A, for example, is input through transmission input terminal 111, and a transmission signal of communication band B, for example, is input through transmission input terminal 112. A transmission signal of communication band C, for example, is input through transmission input terminals 121 and 122.

A transmission signal of communication band A or B in the fourth generation mobile communication system (4G), for example, may be input through transmission input terminal 111, and a transmission signal of communication band A or B in the fifth generation mobile communication system (5G), for example, may be input through transmission input terminal 112. A transmission signal of communication band C in 4G, for example, may be input through transmission input terminal 121, and a transmission signal of communication band C in 5G, for example, may be input through transmission input terminal 122.

It should be noted that switch 41 may be an SPDT switching circuit including: a common terminal that is connected to a transmission input terminal (referred to as a first transmission input terminal) out of transmission input terminals 111, 112, 121, and 122; one selection terminal that is connected to input terminal 115 of transmission amplifier circuit 10; and the other selection terminal that is connected to input terminal 125 of transmission amplifier circuit 20.

In this case, for example, a transmission signal of any one of communication band A, communication band B, and communication band C is selectively input through the first transmission input terminal, and switch 41 switches connection of the first transmission input terminal between transmission amplifier circuit 10 and transmission amplifier circuit 20 according to the transmission signal that has been input. In addition, for example, a transmission signal of 4G and a transmission signal of 5G may be input through the first transmission input terminal, and switch 41 may switch connection of the first transmission input terminal between transmission amplifier circuit 10 and transmission amplifier circuit 20 according to the transmission signals that have been input.

In addition, switch 41 may be implemented as a double pole double throw (DPDT) switching circuit that includes two common terminals and two selection terminals. In this case, the first transmission input terminal is connected to one of the common terminals, and the second transmission input terminal is connected to remaining one of the common terminals. In addition, one of the selection terminals is connected to transmission amplifier circuit 10, and remaining one of the selection terminals is connected to transmission amplifier circuit 20. In this connection configuration, switch 41 switches connection of the one of the common terminals between the one of the selection terminals and the remaining one of the selection terminals, and switches connection of the remaining one of the common terminals between the one of the selection terminals and the remaining one of the selection terminals.

In this case, for example, a transmission signal of communication band A or B is input through the first transmission input terminal, and a transmission signal of communication band C is input through the second transmission input terminal. In addition, for example, a transmission signal of 4G is input through the first transmission input terminal, and a transmission signal of 5G is input through the second transmission input terminal.

Switch 42 includes common terminals 42a and 42b, and selection terminals 42c, 42d, and 42e. Common terminal 42a is connected to output terminal 116 of transmission amplifier circuit 10, and common terminal 42b is connected to output terminal 126 of transmission amplifier circuit 20. Selection terminal 42c is connected to transmission filter 61T, selection terminal 42d is connected to transmission filter 62T, and selection terminal 42e is connected to transmission filter 63T. Switch 42 is disposed on the output terminal side of transmission amplifier circuits 10 and 20. In the above-described connection configuration, switch 42 switches connection of transmission amplifier circuit 10 between transmission filter 61T and transmission filter 62T, and connects and disconnects transmission amplifier circuit 20 and transmission filter 63T. Switch 42 is implemented as, for example, a double pole triple throw (DP3T) switching circuit.

It should be noted that switch 42 may include: a SPDT switch including common terminal 42a and selection terminals 42c and 42d; and a single pole single throw (SPST) switch including common terminal 42b and selection terminal 42e.

Switch 43 includes common terminal 43a and selection terminals 43b, 43c, and 43d. Common terminal 43a is connected to an input terminal of low noise amplifier 30 via matching circuit 54. Selection terminal 43b is connected to reception filter 61R, selection terminal 43c is connected to reception filter 62R, and selection terminal 43d is connected to reception filter 63R. In the above-described connection configuration, switch 43 connects and disconnects low noise amplifier 30 and reception filter 61R, connects and disconnects low noise amplifier 30 and reception filter 62R, and connects and disconnects low noise amplifier 30 and reception filter 63R. Switch 43 is implemented as, for example, a single pole triple throw (SP3T) switching circuit.

Switch 44 is one example of an antenna switch, and connected to antenna connection terminal 100. Switch 44 switches connection of antenna connection terminal 100 between (1) transmission path AT and reception path AR, (2) transmission path BT and reception path BR, and (3) transmission path CT and reception path CR. It should be noted that switch 44 is implemented as a multiple-connection switching circuit capable of simultaneously performing the connection of antenna connection terminal 100 with two or more of the above-described (1) to (3).

It should be noted that the above-described transmission filters 61T to 63T and reception filters 61R to 63R may be, for example, one of an acoustic wave filter using a surface acoustic wave (SAW), an acoustic wave filter using a bulk acoustic wave (BAW), an LC resonant filter, and a dielectric filter, but not limited to these filters.

It should be noted that matching circuits 51 to 54 are not indispensable components for the radio frequency module according to the present disclosure.

In addition, a matching circuit may be disposed between transmission amplifier circuit 10 and switch 42, and between transmission amplifier circuit 20 and switch 42. In addition, a diplexer, a coupler, or the like may be disposed between antenna connection terminal 100 and switch 44.

According to the configuration of radio frequency module 1, transmission amplifier circuit 10, switch 42, transmission filter 61T, matching circuit 51, and switch 44 are included in a first transmission circuit that transfers a transmission signal of communication band A to antenna connection terminal 100. Switch 44, matching circuit 51, reception filter 61R, switch 43, matching circuit 54, and low noise amplifier 30 are included in a first reception circuit that transfers a reception signal of communication band A from antenna 2 via antenna connection terminal 100.

In addition, transmission amplifier circuit 10, switch 42, transmission filter 62T, matching circuit 52, and switch 44 are included in a second transmission circuit that transfers a transmission signal of communication band B to antenna connection terminal 100. Switch 44, matching circuit 52, reception filter 62R, switch 43, matching circuit 54, and low noise amplifier 30 are included in a second reception circuit that transfers a reception signal of communication band B that has been received from antenna 2 via antenna connection terminal 100.

In addition, transmission amplifier circuit 20, switch 42, transmission filter 63T, matching circuit 53, and switch 44 are included in a third transmission circuit that transfers a transmission signal of communication band C to antenna connection terminal 100. Switch 44, matching circuit 53, reception filter 63R, switch 43, matching circuit 54, and low noise amplifier 30 are included in a third reception circuit that transfers a reception signal of communication band C that has been received from antenna 2 via antenna connection terminal 100.

According to the above-described circuit configuration, radio frequency module 1 is capable of at least one of transmitting, receiving, or transmitting and receiving a radio frequency signal of any one of communication band A, communication band B, and communication band C. Radio frequency module 1 is also capable of at least one of simultaneously transmitting, simultaneously receiving, or simultaneously transmitting and receiving a radio frequency signal of any one of communication band A, communication band B, and communication band C.

It should be noted that, the radio frequency module according to the present disclosure may be implemented without connecting the above-described three transmission circuits and the above-described three reception circuits to antenna connection terminal 100 via switch 44, and the above-described three transmission circuits and the above-described three reception circuits may be connected to antenna 2 via different terminals. It is sufficient if the radio frequency module according to the present disclosure includes PA control circuit 80, the first transmission circuit, and the third transmission circuit.

In addition, in the radio frequency module according to the present disclosure, it is sufficient if the first transmission circuit includes transmission amplifier circuit 10. In addition, it is sufficient if the third transmission circuit includes transmission amplifier circuit 20.

In addition, low noise amplifier 30 and at least one of switches 41 to 44 may be disposed in a single semiconductor IC. The semiconductor IC has, for example, a CMOS structure. More specifically, the semiconductor IC is fabricated by SOI processing. This allows manufacturing the semiconductor IC at a low manufacturing cost. It should be noted that the semiconductor IC may include at least one of GaAs, SiGe, or GaN. With this, it is possible to output a radio frequency signal having a high-quality amplification performance and noise characteristics.

Figure 2:
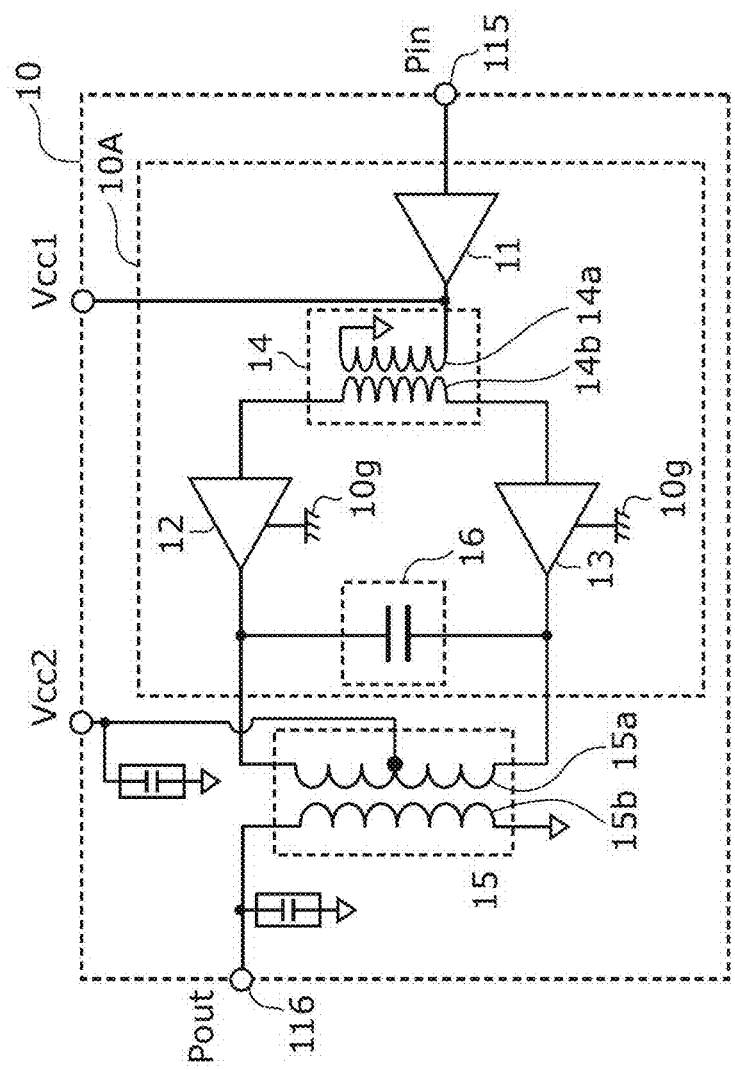
FIG. 2 is a diagram illustrating a circuit configuration of a transmission amplifier circuit.

FIG. 2 is a diagram illustrating a circuit configuration of transmission amplifier circuit 10 according to the embodiment. As illustrated in the diagram, transmission amplifier circuit 10 includes: input terminal 115; output terminal 116; amplifying element 11 (a pre-stage amplifying element); amplifying element 12 (a third amplifying element); amplifying element 13 (a fourth amplifying element); interstage transformer (transformer) 14; capacitor 16; and output transformer (balun: balanced-unbalanced transforming element) 15. Amplifying elements 11 to 13, interstage transformer 14, and capacitor 16 are included in power amplifier 10A. Power amplifier 10A is one example of a first power amplifier.

Interstage transformer 14 includes primary coil 14a and secondary coil 14b.

Amplifying element 11 includes an input terminal connected to input terminal 115, and an output terminal connected to an unbalanced terminal of interstage transformer 14. One of balanced terminals of interstage transformer 14 is connected to an input terminal of amplifying element 12, and a remaining one of the balanced terminals of interstage transformer 14 is connected to an input terminal of amplifying element 13.

A radio frequency signal input through input terminal 115 is amplified by amplifying element 11 in a state in which bias voltage Vcc1 is applied to amplifying element 11. The radio frequency signal that has been amplified is subjected to balanced-unbalanced transformation by interstage transformer 14. At this time, a non-inverted input signal is output from the one of the balanced terminals of interstage transformer 14, and an inverted input signal is output from the remaining one of the balanced terminals of interstage transformer 14.

Output transformer 15 is one example of a first output transformer, and includes primary coil (a first coil) 15a and secondary coil (a second coil) 15b. Primary coil 15a has one end connected to an output terminal of amplifying element 12, and the other end connected to an output terminal of amplifying element 13. In addition, bias voltage Vcc2 is supplied to the midpoint of primary coil 15a. Secondary coil 15b has one end connected to output terminal 116, and the other end connected to the ground. In other words, output transformer 15 is connected between the output terminals of amplifying elements 12 and 13 and output terminal 116.

Capacitor 16 is connected between the output terminal of amplifying element 12 and the output terminal of amplifying element 13.

The non-inverted input signal amplified by amplifying element 12 and the inverted input signal amplified by amplifying element 13 are subjected to impedance-transformation by output transformer 15 and capacitor 16 while being maintained in antiphase. In other words, the output impedance of power amplifier 10A at output terminal 116 is matched with the input impedance of switch 42 and transmission filters 61T and 62T illustrated in FIG. 1, by output transformer 15 and capacitor 16. It should be noted that the capacitive element connected between the ground and the path connecting output terminal 116 and secondary coil 15b also contributes to the above-described impedance matching. The above-described capacitive element may be disposed in series on the path connecting output terminal 116 and secondary coil 15b, or the above-described capacitive element need not necessarily be included.

Here, amplifying elements 11 to 13, interstage transformer 14, and capacitor 16 are included in power amplifier 10A. In particular, amplifying elements 11 to 13 and interstage transformer 14 are often integrally formed as one chip, or on the same board. In contrast, output transformer 15 requires a high Q-value for a high-power transmission signal, and thus is not integrally formed with, for example, amplifying elements 11 to 13 and interstage transformer 14. In other words, among the circuit components included in transmission amplifier circuit 10, the circuit components other than output transformer 15 are included in power amplifier 10A.

It should be noted that amplifying element 11 and capacitor 16 need not necessarily be included in power amplifier 10A.

According to the circuit configuration of transmission amplifier circuit 10, amplifying elements 12 and 13 operate in antiphase. Here, fundamental-wave currents from amplifying elements 12 and amplifying element 13 flow in antiphase; that is, in opposite directions. Accordingly, a fundamental-wave current does not flow into a ground line or a power supply line located at a substantially equal distance from amplifying elements 12 and 13. In view of the above, the inflow of unnecessary current to the above-described lines is negligible. It is thus possible to inhibit a decrease in power gain that is found in conventional transmit amplifier circuits. In addition, since the non-inverted signal and the inverted signal amplified by amplifying elements 12 and 13 are combined, noise components superimposed equally on both of the signals can be canceled, and thus it is possible to reduce spurious waves such as harmonic components.

It should be noted that amplifying element 11 is not an indispensable component for transmission amplifier circuit 10. The element that transforms unbalanced input signals to non-inverted input signals and inverted input signals is not limited to interstage transformer 14. Capacitor 16 is not an indispensable component for performing impedance matching.

In addition, although not illustrated in the diagrams, transmission amplifier circuit 20 has a circuit configuration equivalent to the circuit configuration of transmission amplifier circuit 10 illustrated in FIG. 2. More specifically, transmission amplifier circuit 20 includes: input terminal 125; output terminal 126; amplifying element 21 (a pre-stage amplifying element); amplifying element 22 (a fifth amplifying element); amplifying element 23 (a sixth amplifying element); interstage transformer (transformer) 24; capacitor 26; and output transformer (balun: balanced-unbalanced transforming element) 25. Amplifying elements 21 to 23, interstage transformer 24, and capacitor 26 are included in power amplifier 20A. Power amplifier 20A is one example of a second power amplifier.

Interstage transformer 24 includes primary coil 24a and secondary coil 24b.

Amplifying element 21 includes an input terminal connected to input terminal 125, and an output terminal connected to an unbalanced terminal of interstage transformer 24. One of balanced terminals of interstage transformer 24 is connected to an input terminal of amplifying element 22, and a remaining one of the balanced terminals of interstage transformer 24 is connected to an input terminal of amplifying element 23.

Output transformer 25 is one example of a second output transformer, and includes primary coil (a third coil) 25a and secondary coil (a fourth coil) 25b. Primary coil 25a has one end connected to an output terminal of amplifying element 22, and the other end connected to an output terminal of amplifying element 23. In addition, bias voltage Vcc2 is supplied to the midpoint of primary coil 25a. Secondary coil 25b has one end connected to output terminal 126, and the other end connected to the ground. In other words, output transformer 25 is connected between the output terminals of amplifying elements 22 and 23 and output terminal 126.

Capacitor 26 is connected between the output terminal of amplifying element 22 and the output terminal of amplifying element 23.

Here, amplifying elements 21 to 23, interstage transformer 24, and capacitor 26 are included in power amplifier 20A. In particular, amplifying elements 21 to 23 and interstage transformer 14 are often integrally formed as one chip, or on the same board. In contrast, output transformer 25 is not integrally formed with amplifying elements 21 to 23 and interstage transformer 24, for example.

It should be noted that amplifying element 21 and capacitor 26 need not necessarily be included in power amplifier 20A.

According to the circuit configuration of transmission amplifier circuit 20, it is possible to inhibit decrease in power gain that is found in conventional transmission amplifier circuits. In addition, since the non-inverted signal and the inverted signal amplified by amplifying elements 22 and 23 are combined, noise components superimposed equally on both of the signals can be canceled, and thus it is possible to reduce spurious waves such as harmonic components.

It should be noted that amplifying element 21 is not an indispensable component for transmission amplifier circuit 20. The element that transforms unbalanced input signals to non-inverted input signals and inverted input signals is not limited to interstage transformer 24. Capacitor 26 is not an indispensable component for performing impedance matching.

Amplifying elements 11 to 13 and 21 to 23 and low noise amplifier 30 include, for example, a field-effect transistor (FET), a hetero-junction bipolar transistor (HBT), etc. which include a Si complementary metal oxide semiconductor (CMOS) or GaAs as a material.

It should be noted that transmission amplifier circuit 10 need not necessarily include differential power amplifier 10A, and may be an amplifier that includes a so-called single-end amplifying element which receives an unbalanced signal as an input signal, and outputs an unbalanced signal as an output signal. In addition, transmission amplifier circuit 20 need not necessarily include differential power amplifier 20A, and may be an amplifier that includes a so-called single-end amplifying element which receives an unbalanced signal as an input signal, and outputs an unbalanced signal as an output signal.

Here, in radio frequency module 1, transmission amplifier circuit 10 amplifies transmission signals of communication bands A and B, and transmission amplifier circuit 20 amplifies transmission signals of communication band C. In other words, the amplification performance of each of transmission amplifier circuits 10 and 20 is optimized in a specific frequency band (communication band), and thus radio frequency module 1 need to include a plurality of transmission amplifier circuits that support the respective frequency bands (communication bands). A power amplifier included in a transmission amplification circuit is a component that generates a large amount of heat among the electronic components included in radio frequency module 1. Accordingly, if the number of power amplifiers included in a radio frequency module increases with developments in multi-band technologies, the amount of heat generated by the power amplifiers increases, which can result in the degradation in the performance of the radio frequency module.

In view of the above, the following describes the configuration of a small-sized radio frequency module 1 which supports multi-band technologies and has enhanced heat dissipation properties.

Figure 3B:
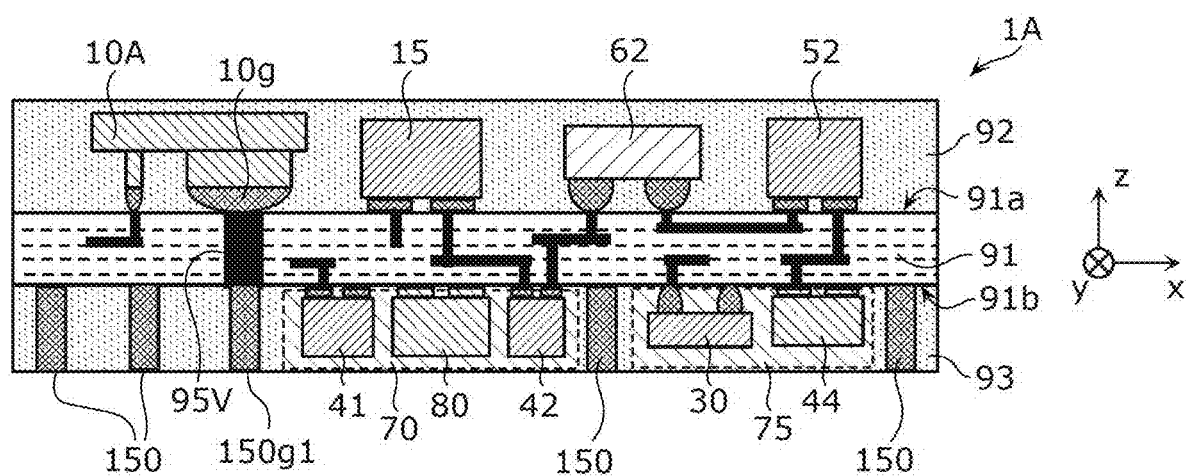
FIG. 3B is a first schematic diagram illustrating a cross-sectional configuration of the radio frequency module according to the working example.
Figure 3C:
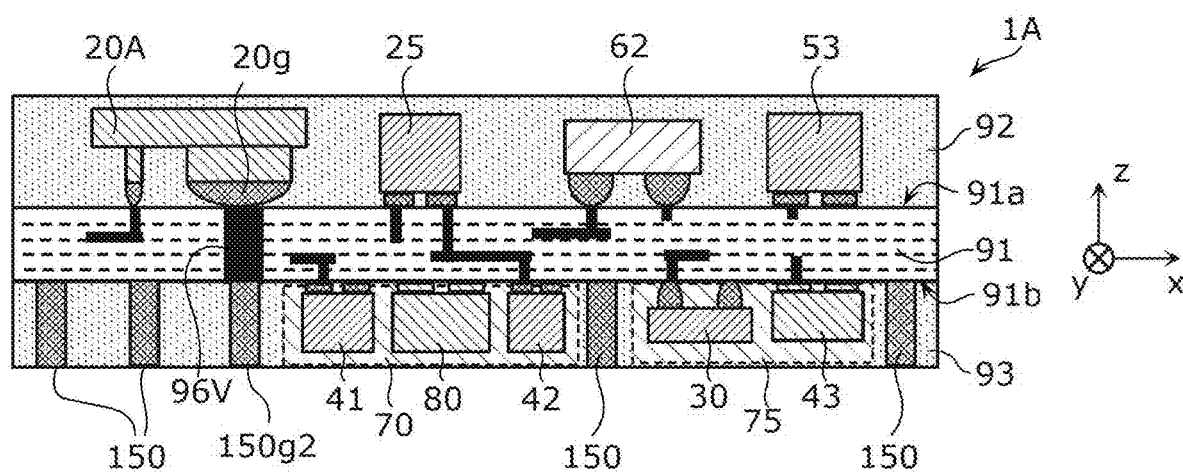
FIG. 3C is a second schematic diagram illustrating a cross-sectional configuration of the radio frequency module according to the working example.

2. Arrangement Configuration of Circuit Elements of Radio Frequency Module 1A According to Working Example FIG. 3A is a schematic diagram illustrating a plan view configuration of radio frequency module 1A according to a working example of the embodiment. FIG. 3B is a schematic diagram illustrating a first cross-sectional configuration of radio frequency module 1A according to the working example. More specifically, FIG. 3B is a cross-sectional view taken along line IIIB-IIIB of FIG. 3A. FIG. 3C is a schematic diagram illustrating a second cross-sectional configuration of radio frequency module 1A according to the working example. More specifically, FIG. 3C is a cross-sectional view taken along line IIIC-IIIC of FIG. 3A. It should be noted that (a) in FIG. 3A illustrates a layout of the circuit elements when, of principal surfaces 91a and 91b located on opposite sides of module board 91, principal surface 91a is viewed from the z-axis positive side. Meanwhile, (b) in FIG. 3A illustrates a perspective view of the layout of the circuit elements when principal surface 91b is viewed from the z-axis positive side.

Radio frequency module 1A according to the working example specifically illustrates the arrangement configuration of the respective circuit elements included in radio frequency module 1 according to the embodiment.

As illustrated in FIG. 3A, FIG. 3B, and FIG. 3C, radio frequency module 1A according to the present working example further includes module board 91, resin components 92 and 93, and external-connection terminals 150 in addition to the circuit configuration illustrated in FIG. 1.

Module board 91 is a board which includes principal surface 91a (a first principal surface) and principal surface 91b (a second principal surface) on opposite sides thereof, and on which the above-described transmission circuit and the above-described reception circuit are mounted. As module board 91, for example, a low temperature co-fired ceramic (LTCC) board having a stacked structure including a plurality of dielectric layers, a high temperature co-fired ceramic (HTCC) board, a component built-in board, a board including a redistribution layer (RDL), or a printed board or the like is used.

Resin component 92 is disposed on principal surface 91a of module board 91 and covers a portion of the above-described transmission circuit, a portion of the above-described reception circuit, and principal surface 91a of module board 91. Resin component 92 has a function of ensuring reliability such as mechanical strength and moisture resistance of the circuit elements included in the above-described transmission circuit and the above-described reception circuit. Resin component 93 is disposed on principal surface 91b of module board 91 and covers a portion of the above-described transmission circuit, a portion of the above-described reception circuit, and principal surface 91b of module board 91. Resin component 93 has a function of ensuring reliability such as mechanical strength and moisture resistance of the circuit elements included in the above-described transmission circuit and the above-described reception circuit. It should be noted that resin components 92 and 93 are optional, and thus not indispensable components for the radio frequency module according to the present disclosure.

As illustrated in FIG. 3A, FIG. 3B, and FIG. 3C, in radio frequency module 1A according to the present working example, power amplifiers 10A and 20A, output transformers 15 and 25, duplexers 61, 62, and 63, and matching circuits 51, 52, 53, and 54 are disposed on principal surface 91a (a first principal surface) of module board 91. Meanwhile, PA control circuit 80, low noise amplifier 30, switches 41, 42, 43, and 44 are disposed on principal surface 91b (a second principal surface) of module board 91.

It should be noted that, although not illustrated in FIG. 3A, lines included in transmission paths AT, BT, and CT, and reception paths AR, BR, and CR illustrated in FIG. 1 are provided inside module board 91, and on principal surfaces 91a and 91b. In addition, each of the above-described lines may be a bonding wire having ends bonded to principal surfaces 91a and 91b and any of the circuit elements included in radio frequency module 1A, or may be a terminal, an electrode, or a line disposed on a surface of any of the circuit elements included in radio frequency module 1A.

In the present working example, power amplifiers 10A and 20A are disposed on principal surface 91a (the first principal surface). Power amplifier 10A is one example of a first power amplifier that amplifies a transmission signal of a first frequency band including communication bands A and B. Power amplifier 20A is one example of a second power amplifier that amplifies a transmission signal of a second frequency band including communication band C. According to the present working example, the first frequency band (communication bands A and B) may be lower than the second frequency band (communication band C). Alternatively, the first frequency band (communication bands A and B) may be higher than the second frequency band (communication band C).

A plurality of external-connection terminals 150 are disposed on principal surface 91b (the second principal surface) of module board 91. Radio frequency module 1A exchanges electrical signals with a motherboard disposed on the z-axis negative side of radio frequency module 1A via the plurality of external-connection terminals 150. As illustrated in (b) in FIG. 3A, the plurality of external-connection terminals include: antenna connection terminal 100; transmission input terminals 111, 112, 121, and 122; reception output terminal 130; and control signal terminal 140. In addition, one or more of the plurality of external-connection terminals 150 are set to ground potential of the motherboard.

As illustrated in FIG. 3A, FIG. 3B, and FIG. 3C, radio frequency module 1A further includes via conductors 95V and 96V. Via conductors 95V are each one example of a first via conductor, and provided inside module board 91 to connect principal surface 91a and principal surface 91b. Via conductors 96V are each one example of a second via conductor, and provided inside module board 91 to connect principal surface 91a and principal surface 91b.

As illustrated in FIG. 3A, via conductors 95V and via conductor 96V are spaced apart from each other inside of module board 91.

As illustrated in FIG. 3B, one of ends of via conductor 95V is connected, on principal surface 91a, to ground electrode 10g (a first ground electrode) of power amplifier 10A, and a remaining one of the ends of via conductor 95V is connected, on principal surface 91b, to external connection terminal 150g1 (a first external connection terminal) set to ground potential among the plurality of external connection terminals 150.

As illustrated in FIG. 3C, one of ends of via conductor 96V is connected, on principal surface 91a, to ground electrode 20g (a second ground electrode) of power amplifier 20A, and a remaining one of the ends of via conductor 96V is connected, on principal surface 91b, to external connection terminal 150g2 (a second external connection terminal) set to ground potential among the plurality of external connection terminals 150.

Each of via conductors 95V and 96V penetrates through module board 91 in the direction normal to principal surfaces 91a and 91b.

Power amplifiers 10A and 20A are components that generate a large amount of heat among the circuit components included in radio frequency module 1A. In order to improve the heat dissipation property of radio frequency module 1A, it is important to dissipate heat generated by power amplifiers 10A and 20A to the motherboard through a heat dissipation path having a small thermal resistance. If power amplifiers 10A and 20A are mounted on principal surface 91b, the electrode lines connected to power amplifiers 10A and 20A are disposed on principal surface 91b. For that reason, a heat dissipation path that passes only though a planar line pattern (along the xy plane direction) on principal surface 91b is included as the heat dissipation path. The above-described planar line pattern is formed using a metal thin film, and thus has a large thermal resistance. For that reason, when power amplifiers 10A and 20A are disposed on principal surface 91b, the heat dissipation property is degraded.

In contrast, radio frequency module 1A according to the present working example further includes via conductor 95V for heat dissipation that is connected, on principal surface 91a, to ground electrode 10g of power amplifier 10A and that extends from principal surface 91a to principal surface 91b, as illustrated in FIG. 3B. In addition, as illustrated in FIG. 3C, radio frequency module 1A according to the present working example further includes via conductor 96V for heat dissipation that is connected, on principal surface 91a, to ground electrode 20g of power amplifier 20A and that extends from principal surface 91a to principal surface 91b, as illustrated in FIG. 3C. In addition, via conductor 95V is connected, on principal surface 91b, to external-connection terminal 150g1 set to ground potential, and via conductor 96V is connected, on principal surface 91b, to external-connection terminal 150g2 set to ground potential.

According to this configuration, it is possible to connect power amplifier 10A and external-connection terminal 150g1 through via conductor 95V for heat dissipation, and to connect power amplifier 20A and external-connection terminal 150g2 through via conductor 96V for heat dissipation. As a result, it is possible to exclude a heat dissipation path that passes only through the planar line pattern along the xy plane direction which has a large thermal resistance, from among the lines in module board 91 as the heat dissipation paths for power amplifiers 10A and 20A. Furthermore, since via conductor 95V and via conductor 96V are spaced apart from each other in module board 91, it is possible to inhibit heat exchange between power amplifier 10A and power amplifier 20A. If via-conductor 95V and via-conductor 96V are bonded with each other inside module board 91, heat will flow through via conductors 95V and 96V from one of the two power amplifiers that generates a greater amount of heat into the other of the power amplifiers that generates a smaller amount of heat. This would result in the degradation in the amplification performance of the power amplifier that generates a smaller amount of heat. Via conductors 95V and 96V penetrate through module board 91 in the direction normal to principal surfaces 91a and 91b, and thus have significantly low thermal resistance. Accordingly, with via conductors 95V and 96V, it is possible to efficiently dissipate heat generated from power amplifier 10A and heat generated from power amplifier 20A through an independent heat dissipation path to outside of radio frequency module 1A. It is thus possible to provide radio frequency module 1A having an improved heat dissipation property for dissipating heat from power amplifiers 10A and 20A to the motherboard, while reducing heat transfer between the power amplifiers inside of the module.

It should be noted that, in regard to via conductors 95A and 96V in the present working example, the via conductor that penetrates through module board 91 in a normal direction that is a direction normal to principal surfaces 91a and 91b refers to not only a single conductor having a columnar or prismatic columnar shape located along the above-described normal direction, but also to a via conductor having a shape described below.

Figure 4:
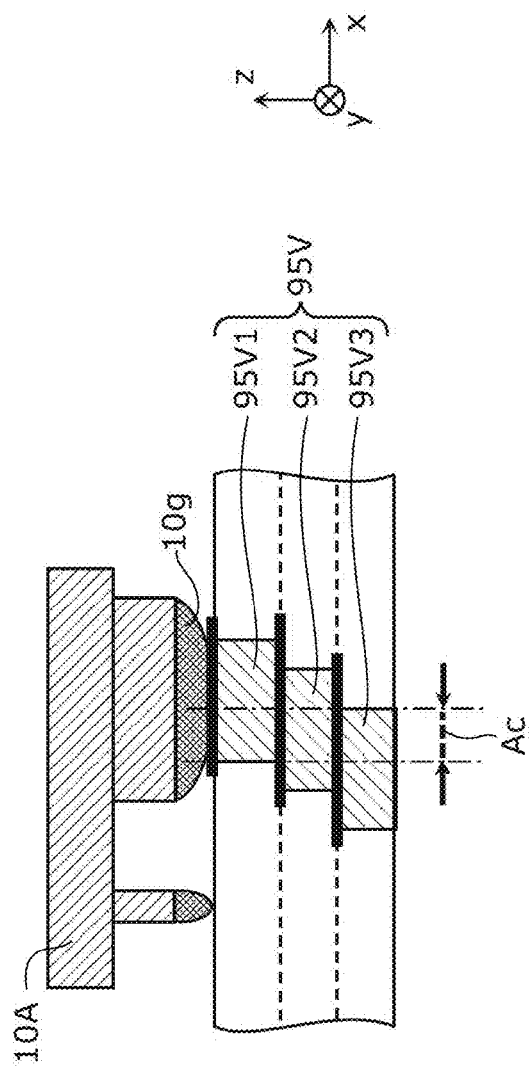
FIG. 4 is a schematic diagram illustrating a cross-sectional configuration of a heat dissipation via of a radio frequency module according to Variation 1.

FIG. 4 is a schematic diagram illustrating a cross-sectional configuration of via conductor 95V of a radio frequency module according to Variation 1. This diagram illustrates power amplifier 10A included in the radio frequency module according to Variation 1 and a portion of module board 91. As illustrated in the diagram, via conductor 95V according to the present variation includes a plurality of columnar conductors 95V1, 95V2, and 95V3 each extending in a normal direction that is a direction normal to principal surfaces 91a and 91b, and the plurality of columnar conductors 95V1, 95V2, and 95V3 are cascaded in the normal direction. Here, in a plan view of module board 91, via conductor 95V according to the present variation has region Ac overlapping each of the plurality of columnar conductors 95V1, 95V2, and 95V3. In other words, via conductor 95V that has the above-described region Ac is also included in via conductor that penetrates through module board 91 in the normal direction.

Since via conductor 95V according to the above-described variation has region Ac, it is possible to achieve a significantly low thermal resistance. As a result, it is possible to efficiently dissipate heat generated by power amplifier 10A to the outside of radio frequency module 1A.

It should be noted that it is sufficient if at least one columnar conductor is included in via conductor 95V according to the present working example.

In addition, via conductor 96V connected to power amplifier 20A may have a configuration equivalent to the configuration of via conductor 95V according to Variation 1.

It should be noted that, when the first frequency band (communication bands A and B) is lower than the second frequency band (communication band C), power amplifier 20A that amplifies a transmission signal of the second frequency band (communication band C) tends to generate a larger amount of heat than power amplifier 10A that amplifies a transmission signal of the first frequency band (communication bands A and B). In this case, via conductor 96V connected to power amplifier 20A may be a single conductor having a columnar or prismatic columnar shape located along the direction normal to principal surfaces 91a and 91*b*, and via conductor 95V connected to power amplifier 10A may be via conductor 95V according to Variation 1.

According to this configuration, it is possible to reduce the thermal resistance of the heat dissipation path of power amplifier 20A that tends to generate a large amount of heat. As a result, it is possible to achieve efficient and balanced heat dissipation between the two power amplifiers 10A and 20A.

In addition, as illustrated in (a) in FIG. 3A, in radio frequency module 1A according to the working example, in a plan view of module board 91, the region in which via conductor 95V is provided may be within the region in which ground electrode 10*g* is provided on principal surface 91*a*, and the region in which via conductor 96V is provided may be within the region in which ground electrode 20*g* is provided on principal surface 91*a*.

According to this configuration, it is possible to maximizes the area in which ground electrode 10*g* of power amplifier 10A and via conductor 95V are in contact with each other, and thus the thermal resistance at the connection interface can be reduced. In addition, it is possible to maximizes the area in which ground electrode 20*g* of power amplifier 20A and via conductor 96V are in contact with each other, and thus the thermal resistance at the connection interface can be reduced. As a result, it is possible to maintain high heat dissipation properties for dissipating heat from power amplifier 10A and 20A to the motherboard.

In addition, power amplifier 10A and power amplifier 20A may be included in a single first semiconductor IC. According to this configuration, it is possible to efficiently dissipate heat generated by power amplifier 10A and heat generated by power amplifier 20A respectively through separate heat dissipation paths to the outside of radio frequency module 1A, while reducing the size of the transmission amplifier circuit.

In addition, power amplifier 10A may include a plurality of first amplifying elements that are cascaded with each other. In this case, it is desirable that ground electrode 10*g* connected to via conductor 95V be connected to one of the plurality of first amplification elements that is located at the last stage of the above-described plurality of first amplification elements.

According to this configuration, since via-conductor 95V is connected to the first amplification element located at the last stage that generates the largest amount of heat among the above-described plurality of first amplification elements, it is possible to efficiently dissipate heat generated by power amplifier 10A to the outside of radio frequency module 1A.

In addition, power amplifier 20A may include a plurality of second amplifying elements that are cascaded with each other. In this case, it is desirable that ground electrode 20*g* connected to via conductor 96V be connected to one of the plurality of second amplification elements that is located at the last stage of the above-described plurality of second amplification elements.

According to this configuration, since via-conductor 96V is connected to the second amplification element located at the last stage that generates the largest amount of heat among the above-described plurality of second amplification elements, it is possible to efficiently dissipate heat generated by power amplifier 20A to the outside of radio frequency module 1A.

In addition, in radio frequency module 1A according to the present working example, PA control circuit 80 is mounted on principal surface 91*b* (the second principal surface).

According to this configuration, power amplifiers 10A and 20A and PA control circuit 80 that controls power amplifiers 10A and 20A are mounted on different surfaces of module board 91, and thus it is possible to miniaturize radio frequency module 1A. Furthermore, since PA control circuit 80 that inputs/outputs digital control signals and power amplifiers 10A and 20A are disposed with module board 91 interposed therebetween, it is possible to inhibit power amplifiers 10A and 20A from being affected by a digital noise. As a result, it is possible to reduce degradation of the signal quality of radio frequency signals output from power amplifiers 10A and 20A.

In addition, in radio frequency module 1A according to the present working example, switch 42 is mounted on principal surface 91*b* (the second principal surface).

According to this configuration, power amplifiers 10A and 20A and switch 42 through which output signals of power amplifiers 10A and 20A pass are mounted on different surfaces of module board 91, and thus it is possible to miniaturize radio frequency module 1A. In addition, switch 42 in which off-capacitance is present between the common terminal and an unconnected selection terminal, and power amplifiers 10A and 20A are disposed with module board 91 interposed therebetween. According to this configuration, it is possible to inhibit transmission signals output from power amplifiers 10A and 20A from leaking to an unconnected transmission path or an unconnected reception path via the off-capacitance. As a result, it is possible to reduce degradation of the signal quality of radio frequency signals output from power amplifiers 10A and 20A.

In addition, in radio frequency module 1A according to the present working example, switch 41 is mounted on principal surface 91*b* (the second principal surface).

According to this configuration, power amplifiers 10A and 20A and switch 41 through which input signals of power amplifiers 10A and 10A pass are mounted on different surfaces of module board 91, and thus it is possible to miniaturize radio frequency module 1A. In addition, switch 41 in which off-capacitance is present between the common terminal and an unconnected selection terminal, and power amplifiers 10A and 20A are disposed with module board 91 interposed therebetween. According to this configuration, it is possible to inhibit a transmission signal input through the transmission input terminal from leaking to the unconnected power amplifier via the above-described off-capacitance. As a result, it is possible to reduce degradation of the signal quality of radio frequency signals output from power amplifiers 10A and 20A.

In addition, in radio frequency module 1A according to the present working example, PA control circuit 80 and switches 41 and may be included in a single semiconductor IC 70, and semiconductor IC 70 may be disposed on principal surface 91*b*.

According to this configuration, PA control circuit 80, switch 41, and switch 42 which are connected to transmission amplifier circuits 10 and 20 are located in proximity to one another, and thus it is possible to miniaturize radio frequency module 1A. Furthermore, since the control line that connects PA control circuit 80 and switch 41 and the control line that connects PA control circuit 80 and switch 42 can be shortened, it is possible to inhibit noise generation from the control lines. It should be noted that semiconductor IC 70 may not include at least one of switch 41 or switch 42.

In addition, as illustrated in FIG. 3A, it is desirable that a footprint of semiconductor IC 70 does not overlap a footprint of power amplifier 10A or a footprint of power amplifier 20A in a plan view of module board 91.

According to this configuration, semiconductor IC 70 is not located in a region on principal surface 91b that corresponds to a dissipation path of power amplifiers 10A and 20A, and thus it is possible to inhibit property degradation of PA control circuit 80 and switches 41 and 42 due to heat generated by power amplifiers 10A and 20A.

In addition, in radio frequency module 1A according to the present working example, low noise amplifier 30 is disposed on principal surface 91b (the second principal surface). Here, in a plan view of module board 91, external-connection terminals 150 that is set to ground potential is disposed between semiconductor IC 70 and low noise amplifier 30.

According to this configuration, a plurality of external-connection terminals 150 which are applied as ground electrodes are disposed between low noise amplifier 30 that significantly affects the reception sensitivity of the reception circuit and PA control circuit 80 that inputs/outputs digital control signals. Accordingly, it is possible to inhibit degradation of reception sensitivity due to digital noise. In addition, power amplifiers 10A and 20A that amplify transmission signals and low noise amplifier 30 that amplifies reception signals are separately disposed on different surfaces of module board 91, and thus it is possible to improve isolation between a transmission side and a reception side.

In radio frequency module 1A according to the present working example, low noise amplifier 30 and switches 43 and 44 are included in a single semiconductor IC 75, and the single semiconductor IC 75 is disposed on principal surface 91b. According to this configuration, low noise amplifier 30, switch 43, and switch 44 disposed on the reception path are located in proximity to one another, and thus it is possible to miniaturize radio frequency module 1A. It should be noted that semiconductor IC 75 may not include at least one of switch 43 or switch 44.

It should be noted that, although output transformers 15 and 25, duplexers 61 to 63, and matching circuits 51 to 54 are mounted on principal surface 91a (the first principal surface) in radio frequency module 1A according to the present working example, output transformers 15 and 25, duplexers 61 to 63, and matching circuits 51 to 54 may be mounted on principal surface 91b (the second principal surface). In addition, although PA control circuit 80, low noise amplifier 30, and switches 41 to 44 are mounted on principal surface 91b (the second principal surface) in radio frequency module 1A according to the present working example, PA control circuit 80, low noise amplifier 30, and switches 41 to 44 may be mounted on principal surface 91a (the first principal surface).

It is desirable that module board 91 have a multilayer structure in which a plurality of dielectric layers are laminated, and that a ground electrode pattern be formed in at least one of the plurality of dielectric layers. According to this configuration, the electromagnetic field shielding function of module board 91 is improved.

In addition, in radio frequency module 1A according to the present working example, although output transformers 15 and 25 are disposed on principal surface 91a, output transformers 15 and 25 may be disposed on principal surface 91b, or may be provided inside module board 91. When output transformers 15 and 25 are provided inside module board 91, the inductors included in output transformers 15 and 25 are planar coils implemented by electric conduction patterns of module board 91, for example. In such arrangement configuration of output transformers 15 and 25, it is desirable that the footprints of power amplifiers 10A and 20A each do not overlap a footprint of output transformer 15 or a footprint of output transformer 25 in a plan view of module board 91.

Output transformers 15 and 25 each require a high Q-factor for a high-power transmission signal. Accordingly, it is desirable to avoid a change in magnetic fields formed by output transformers 15 and 25 due to power amplifiers 10A and 20A being located in proximity to output transformers 15 and 25. Power amplifiers 10A and 20A are not disposed in the above-described region where the footprints of power amplifiers 10A and 20A overlap the footprints of output transformers 15 and 25, and thus it is possible to maintain a high Q-factor of each of the inductors included in output transformers 15 and 25.

Figure 5:
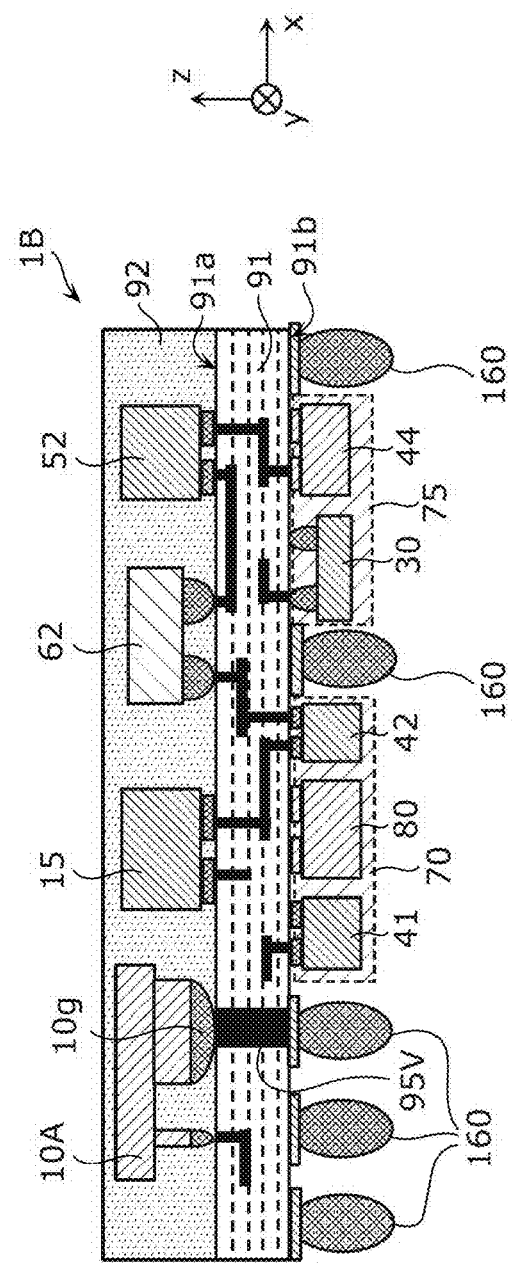
FIG. 5 is a schematic diagram illustrating a cross-sectional configuration of a radio frequency module according to Variation 2.

It should be noted that external-connection terminals 150 may be columnar electrodes that penetrate through resin component 93 along the z-axis as illustrated in FIG. 3A to FIG. 3C, or may be bump electrodes 160 provided on principal surface 91b as in radio frequency module 1B according to Variation 2 as illustrated in FIG. 5. In this case, resin component 93 need not be provided on principal surface 91b.

3. Advantageous Effects, Etc.

As described above, radio frequency module 1 according to the embodiment includes module board 91 including principal surface 91a and principal surface 91b on opposite sides of module board 91; power amplifier 10A disposed on principal surface 91a and configured to amplify a transmission signal of a first frequency band; power amplifier 20A disposed on principal surface 91a and configured to amplify a transmission signal of a second frequency band different from the first frequency band; a plurality of external-connection terminals 150 disposed on principal surface 91b; and via conductors 95V and 96V provided in module board 91 and each connecting principal surface 91a and principal surface 91b. In radio frequency module 1 according to the embodiment, via conductors 95V and 96V are spaced apart from each other in module board 91, one of ends of via conductor 95V is connected, on principal surface 91a, to ground electrode 10g of power amplifier 10A, and a remaining one of the ends of via conductor 95V is connected, on principal surface 91b, to external-connection terminal 150g1 that is set to ground potential, one of ends of via conductor 96V is connected, on principal surface 91a, to ground electrode 20g of power amplifier 20A, and a remaining one of the ends of via conductor 96V is connected, on principal surface 91b, to external-connection terminal 150g2 that is set to ground potential, and via conductors 95V and 96V each penetrate through module board 91 in a direction normal to principal surfaces 91a and 91b.

According to this configuration, it is possible to connect power amplifier 10A and external-connection terminal 150g1 through via conductor 95V, and to connect power amplifier 20A and external-connection terminal 150g2 through via conductor 96V. As a result, it is possible to exclude a heat dissipation path that passes only through the planar line pattern along the xy plane direction which has a large thermal resistance, from among the lines in module board 91 as the heat dissipation paths for power amplifiers 10A and 20A. Furthermore, since via conductors 95V and via conductors 96V are spaced apart from each other in module board 91, it is possible to inhibit heat exchange between power amplifier 10A and power amplifier 20A. Via conductors 95V and 96V penetrate through module board 91 in the direction normal to principal surfaces 91a and 91b, and thus have significantly low thermal resistance. Accordingly, with via conductors 95V and 96V, it is possible to effectively dissipate heat generated from power amplifier 10A and heat generated from power amplifier 20A through an independent heat dissipation path to outside of radio frequency module 1. It is thus possible to provide radio frequency module 1 having an enhanced heat dissipation property for dissipating heat from power amplifiers 10A and 20A to the motherboard.

In addition, in radio frequency module 1, at least one of via conductor 95V or via conductor 96V: may include a plurality of columnar conductors cascaded in the direction normal to principal surface 91a and each extending in the direction normal to principal surface 91a; and may have a region overlapping each of the plurality of columnar conductors in a plan view of module board 91.

According to this configuration, since at least one of via conductor 95V or via conductor 96V has a significantly low thermal resistance, it is possible to efficiently dissipate heat generated by power amplifier 10A or power amplifier 20A to the outside of radio frequency module 1.

In addition, in radio frequency module 1, in a plan view of module board 91, on principal surface 91a, a region in which via conductor 95V is provided may be within a region in which ground electrode 10g is provided, and a region in which via conductor 96V is provided may be within a region in which ground electrode 20g is provided.

According to this configuration, it is possible to maximizes the area in which ground electrode 10g of power amplifier 10A and via conductor 95V are in contact with each other, and thus the thermal resistance at the connection interface can be reduced. In addition, it is possible to maximizes the area in which ground electrode 20g of power amplifier 20A and via conductor 96V are in contact with each other, and thus the thermal resistance at the connection interface can be reduced. As a result, it is possible to maintain high heat dissipation properties for dissipating heat from power amplifier 10A and 20A to the motherboard.

In addition, in radio frequency module 1, power amplifier 10A and power amplifier 20A may be included in a single first semiconductor integrated circuit (IC).

According to this configuration, it is possible to efficiently dissipate heat generated by power amplifier 10A and heat generated by power amplifier 20A respectively through separate heat dissipation paths to the outside of radio frequency module 1, while reducing the size of the transmission amplifier circuit.

In addition, in radio frequency module 1, power amplifier 10A may include a plurality of first amplifying elements that are cascaded with each other, power amplifier 20A may include a plurality of second amplifying elements that are cascaded with each other, ground electrode 10g may be connected to one of the plurality of first amplification elements that is located at a last stage of the plurality of first amplification elements, and ground electrode 20g may be connected to one of the plurality of second amplification elements that is located at a last stage of the plurality of second amplification elements.

According to this configuration, since via conductor 95V is connected to the first amplification element located at the last stage that generates the largest amount of heat among the above-described plurality of first amplification elements, it is possible to efficiently dissipate heat generated by power amplifier 10A to the outside of radio frequency module 1. In addition, since via conductor 96V is connected to the second amplification element located at the last stage that generates the largest amount of heat among the above-described plurality of second amplification elements, it is possible to efficiently dissipate heat generated by power amplifier 20A to the outside of radio frequency module 1.

In addition, in radio frequency module 1, power amplifier 10A may include amplifying element 12 and amplifying element 13, and power amplifier 20A may include amplifying element 22 and amplifying element 23. Radio frequency module 1 may further include: output transformer 15 including primary coil 15a and secondary coil 15b; and output transformer 25 including primary coil 25a and secondary coil 25b. One of ends of primary coil 15a may be connected to an output terminal of amplifying element 12 and a remaining one of the ends of primary coil 15a may be connected to an output terminal of amplifying element 13. One of ends of secondary coil 15b may be connected to an output terminal of transmission amplifier circuit 10. One of ends of primary coil 25a may be connected to an output terminal of amplifying element 22, and a remaining one of the ends of primary coil 25a may be connected to an output terminal of amplifying element 23. One of ends of secondary coil 25b may be connected to an output terminal of transmission amplifier circuit 20. Power amplifier 10A and output transformer 15 may be included in transmission amplifier circuit 10, power amplifier 20A and output transformer 25 may be included in transmission amplifier circuit 20, ground electrode 10g may be connected to amplifying element 12 and amplifying element 13, and ground electrode 20g may be connected to amplifying element 22 and amplifying element 23.

According to this configuration, amplifying elements 12 and 13 operate in antiphase, and thus it is possible to inhibit a decrease in power gain of transmission amplifier circuit 10. In addition, amplifying elements 22 and 23 operate in antiphase, and thus it is possible to inhibit a decrease in power gain of transmission amplifier circuit 20. Furthermore, since the non-inverted signal and the inverted signal amplified by amplifying elements 12 and 13 are combined, and the non-inverted signal and the inverted signal amplified by amplifying elements 22 and 23 are combined, it is possible to reduce spurious waves such as harmonic components in radio frequency module 1.

In addition, radio frequency module 1 may further include PA control circuit 80 configured to control power amplifier 10A and power amplifier 20A, and PA control circuit 80 may be disposed on principal surface 91b.

According to this configuration, power amplifiers 10A and 20A and PA control circuit 80 that controls power amplifiers 10A and 20A are mounted on different surfaces of module board 91, and thus it is possible to miniaturize radio frequency module 1. In addition, it is possible to inhibit power amplifiers 10A and 20A from being affected by a digital noise. As a result, it is possible to reduce degradation of the signal quality of radio frequency signals output from power amplifiers 10A and 20A.

In addition, radio frequency module 1 may further include switch 42 connected to an output terminal of power amplifier 10A and an output terminal of power amplifier 20A, and switch 42 may be disposed on principal surface 91b.

According to this configuration, power amplifiers 10A and 20A and switch 42 through which output signals of power amplifiers 10A and 20A pass are mounted on different surfaces of module board 91, and thus it is possible to miniaturize radio frequency module 1. In addition, it is possible to inhibit transmission signals output from power amplifiers 10A and 20A from leaking to an unconnected transmission path or an unconnected reception path via the off-capacitance of switch 42. As a result, it is possible to reduce degradation of the signal quality of radio frequency signals output from power amplifiers 10A and 20A.

In addition, radio frequency module 1 may further include switch 41 connected to an input terminal of power amplifier 10A and an input terminal of power amplifier 20A, and switch 41 may be disposed on principal surface 91b.

According to this configuration, power amplifiers 10A and 20A and switch 41 through which input signals to power amplifiers 10A and 10A pass are mounted on different surfaces of module board 91, and thus it is possible to miniaturize radio frequency module 1. In addition, it is possible to inhibit a transmission signal input through the transmission input terminal from leaking to the unconnected power amplifier via the off-capacitance of switch 41. As a result, it is possible to reduce degradation of the signal quality of radio frequency signals output from power amplifiers 10A and 20A.

In addition, in radio frequency module 1, PA control circuit, switch 41, and switch 42 may be included in a single semiconductor integrated circuit (IC) 70.

According to this configuration, PA control circuit 80, switch 41, and switch 42 are located in proximity to one another, and thus it is possible to miniaturize radio frequency module 1. Furthermore, since the control line that connects PA control circuit 80 and switch 41 and the control line that connects PA control circuit 80 and switch 42 can be shortened, it is possible to inhibit noise generation from the control lines.

In addition, in a plan view of module board 91, the footprint of semiconductor IC 70 may not overlap the footprint of power amplifier 10A or the footprint of power amplifier 20A.

According to this configuration, semiconductor IC 70 is not located in a region that corresponds to a dissipation path of power amplifiers 10A and 20A on principal surface 91b, and thus it is possible to inhibit property degradation of PA control circuit 80 and switches 41 and 42 due to heat generated by power amplifiers 10A and 20A.

In addition, radio frequency module 1 may further include low noise amplifier 30 disposed on principal surface 91b, and in a plan view of module board 91, at least one external-connection terminal 150 set to ground potential may be disposed between semiconductor IC 70 and low noise amplifier 30.

According to this configuration, at least one external-connection terminal 150 that is applied as a ground electrode is disposed between low noise amplifier 30 that significantly affects the reception sensitivity of the reception circuit and PA control circuit 80 that inputs/outputs digital control signals. Accordingly, it is possible to inhibit degradation of reception sensitivity due to digital noise. In addition, power amplifiers 10A and 20A that amplify transmission signals and low noise amplifier 30 that amplifies reception signals are separately disposed on different surfaces of module board 91, and thus it is possible to improve isolation between a transmission side and a reception side.

In addition, communication device 5 includes antenna 2; RFIC 3 configured to process radio frequency signals transmitted and received by antenna 2; and radio frequency module 1 configured to transfer the radio frequency signals between antenna 2 and RFIC 3.

According to this configuration, it is possible to provide communication device 5 that has enhanced heat dissipation properties and supports multi-band technologies.

Other Embodiments, Etc.

Although the radio frequency module and the communication device according to the embodiment of the present disclosure have been described above based on the embodiment, the working examples, and the variations, the radio frequency module and the communication device according to the present disclosure are not limited to the foregoing embodiment, working examples, and variations. The present disclosure also encompasses: other embodiments achieved by combining arbitrary structural components in the above-described embodiment, working examples, and variations; variations resulting from various modifications to the above-described embodiment, working examples, and variations that may be conceived by those skilled in the art without departing from the essence of the present disclosure; and various devices that include the above-described radio frequency module and the communication device.

For example, in the radio frequency module and the communication device according to the foregoing embodiment, working examples, and the variations, another circuit element and line, for example, may be inserted in a path connecting circuit elements and a signal path which are disclosed in the drawings.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is applicable widely to communication apparatuses such as mobile phones as a radio frequency module disposed in a multiband-compatible front-end unit.

The invention claimed is:
1. A radio frequency module, comprising:
a module board including a first principal surface and a second principal surface on opposite sides of the module board;
a first power amplifier disposed on the first principal surface and configured to amplify a transmission signal of a first frequency band;
a second power amplifier disposed on the first principal surface and configured to amplify a transmission signal of a second frequency band different from the first frequency band;
a plurality of external-connection terminals disposed on the second principal surface;
a first via conductor provided in the module board, the first via conductor connecting the first principal surface and the second principal surface; and
a second via conductor provided in the module board, the second via conductor connecting the first principal surface and the second principal surface, wherein
the first via conductor and the second via conductor are spaced apart from each other in the module board,
a first end of the first via conductor is connected, on the first principal surface, to a first ground electrode of the first power amplifier, and a second end of the first via conductor is connected, on the second principal surface, to a first external-connection terminal of the plurality of external-connection terminals, the first external-connection terminal being set to ground potential,
a first end of the second via conductor is connected, on the first principal surface, to a second ground electrode of the second power amplifier, and second end of the second via conductor is connected, on the second principal surface, to a second external-connection terminal of the plurality of external-connection terminals, the second external-connection terminal being set to ground potential, and the first via conductor and the second via conductor each penetrate through the module board in a direction normal to the first principal surface.

2. The radio frequency module of claim 1, wherein at least one of the first via conductor and the second via conductor include a plurality of columnar conductors each extending in the direction normal to the first principal surface, the plurality of columnar conductors being cascaded in the direction normal to the first principal surface.

3. The radio frequency module of claim 2, wherein the at least one of the first via conductor and the second via conductor include a region overlapping each of the plurality of columnar conductors in a plan view of the module board.

4. The radio frequency module of claim 1, wherein in a plan view of the module board, on the first principal surface, a region in which the first via conductor is provided is within a region in which the first ground electrode is provided, and a region in which the second via conductor is provided is within a region in which the second ground electrode is provided.

5. The radio frequency module of claim 1, wherein the first power amplifier and the second power amplifier are included in a single semiconductor integrated circuit (IC).

6. The radio frequency module of claim 1, wherein the first power amplifier includes a plurality of first amplifying elements that are cascaded, and the second power amplifier includes a plurality of second amplifying elements that are cascaded.

7. The radio frequency module of claim 6, wherein the first ground electrode is connected to one of the plurality of first amplification elements that is located at a last stage of the plurality of first amplification elements, and the second ground electrode is connected to one of the plurality of second amplification elements that is located at a last stage of the plurality of second amplification elements.

8. The radio frequency module of claim 1, wherein the first power amplifier includes a first amplifying element and a second amplifying element, the second power amplifier includes a third amplifying element and a fourth amplifying element.

9. The radio frequency module of claim 8, further comprising:

a first output transformer including a first coil and a second coil; and a second output transformer including a third coil and a fourth coil, wherein a first end of the first coil is connected to an output terminal of the first amplifying element and a second end of the first coil is connected to an output terminal of the second amplifying element.

10. The radio frequency module of claim 9, wherein a first end of the third coil is connected to an output terminal of the third amplifying element and a second end of the third coil is connected to an output terminal of the fourth amplifying element.

11. The radio frequency module of claim 10, wherein the first power amplifier and the first output transformer are included in a first transmission amplifier circuit, the second power amplifier and the second output transformer are included in a second transmission amplifier circuit, the first ground electrode is connected to the first amplifying element and the second amplifying element, and the second ground electrode is connected to the third amplifying element and the fourth amplifying element.

12. The radio frequency module of claim 1, further comprising:

a control circuit disposed on the second principal surface and configured to control the first power amplifier and the second power amplifier.

13. The radio frequency module of claim 1, further comprising:

a switch disposed on the second principal surface and connected to an output terminal of the first power amplifier and an output terminal of the second power amplifier.

14. The radio frequency module of claim 1, further comprising:

a switch disposed on the second principal surface and connected to an input terminal of the first power amplifier and an input terminal of the second power amplifier.

15. The radio frequency module of claim 1, further comprising:

a control circuit configured to control the first power amplifier and the second power amplifier;

a first switch connected to an output terminal of the first power amplifier and an output terminal of the second power amplifier; and a second switch connected to an input terminal of the first power amplifier and an input terminal of the second power amplifier, wherein the control circuit, the first switch, and the second switch are included in a single semiconductor integrated circuit (IC) disposed on the second principal surface.

16. The radio frequency module of claim 15, wherein in a plan view of the module board, a footprint of the semiconductor IC does not overlap a footprint of the first power amplifier or a footprint of the second power amplifier.

17. The radio frequency module of claim 15, further comprising:

a low noise amplifier disposed on the second principal surface and configured to amplify a reception signal, wherein in a plan view of the module board, at least one external-connection terminal set to ground potential of the plurality of external-connection terminals is disposed between the second semiconductor IC and the low noise amplifier.

18. A communication device, comprising:

an antenna;

a radio frequency (RF) signal processing circuit configured to process radio frequency signals transmitted and received by the antenna; and a radio frequency module configured to transfer the radio frequency signals between the antenna and the RF signal processing circuit, wherein the radio frequency module comprises a module board including a first principal surface and a second principal surface on opposite sides of the module board;

a first power amplifier disposed on the first principal surface and configured to amplify a transmission signal of a first frequency band;

a second power amplifier disposed on the first principal surface and configured to amplify a transmission signal of a second frequency band different from the first frequency band;

a plurality of external-connection terminals disposed on the second principal surface;

a first via conductor provided in the module board, the first via conductor connecting the first principal surface and the second principal surface; and a second via conductor provided in the module board, the second via conductor connecting the first principal surface and the second principal surface, wherein the first via conductor and the second via conductor are spaced apart from each other in the module board, a first end of the first via conductor is connected, on the first principal surface, to a first ground electrode of the first power amplifier, and a second end of the first via conductor is connected, on the second principal surface, to a first external-connection terminal of the plurality of external-connection terminals, the first external-connection terminal being set to ground potential, a first end of the second via conductor is connected, on the first principal surface, to a second ground electrode of the second power amplifier, and second end of the second via conductor is connected, on the second principal surface, to a second external-connection terminal of the plurality of external-connection terminals, the second external-connection terminal being set to ground potential, and the first via conductor and the second via conductor each penetrate through the module board in a direction normal to the first principal surface.

19. A radio frequency module, comprising:

a module board including a first surface and a second principal surface on opposite sides of the module board;

a first power amplifier disposed on the first principal surface;

a second power amplifier disposed on the first principal surface;

a plurality of external connection terminals disposed on the second principal surface;

a first via conductor provided in the module board, the first via conductor connecting the first principal surface and the second principal surface; and a second via conductor provided in the module board, the second via conductor connecting the first principal surface and the second principal surface, wherein the first via conductor and the second via conductor are spaced apart from each other in the module board, the first via conductor is connected, on the first principal surface, to the first power amplifier and, on the second principal surface, a first external connection terminal that is set to ground potential, and the second via conductor is connected, on the first principal surface, to the second power amplifier and, on the second principal surface, to a second external connection terminal that is set to ground potential.

20. The radio frequency module of claim 19, wherein at least one of the first via conductor and the second via conductor include a plurality of columnar conductors each extending in the direction normal to the first principal surface, the plurality of columnar conductors being cascaded in the direction normal to the first principal surface.

* * * * *